(12) United States Patent
Joung et al.

(10) Patent No.: US 7,400,027 B2
(45) Date of Patent: Jul. 15, 2008

(54) NONVOLATILE MEMORY DEVICE HAVING TWO OR MORE RESISTANCE ELEMENTS AND METHODS OF FORMING AND USING THE SAME

(75) Inventors: Young-Soo Joung, Seoul (KR); Yoon-Dong Park, Yongin-si (KR); In-Kyeong Yoo, Suwon-si (KR); Myoung-Jae Lee, Suwon-si (KR); Sun-Ae Seo, Hwaseong-si (KR); Hye-Young Kim, Seongnam-si (KR); Seung-Eon Ahn, Seoul (KR); David Seo, Yongin-si (KR)

(73) Assignee: Samsung Electronics, Co., LTD, Gyeonggi-do (KR)

( * ) Notice: Subject to any disclaimer, the term of this patent is extended or adjusted under 35 U.S.C. 154(b) by 0 days.

(21) Appl. No.: 11/312,744

(22) Filed: Dec. 21, 2005

(65) Prior Publication Data

US 2006/0131554 A1    Jun. 22, 2006

(30) Foreign Application Priority Data

Dec. 21, 2004  (KR)  ............... 10-2004-0109268

(51) Int. Cl.
*H01L 23/62* (2006.01)
(52) U.S. Cl. ............... 257/540; 257/358; 257/350; 257/516; 257/E23.044
(58) Field of Classification Search ............... None
See application file for complete search history.

(56) References Cited

U.S. PATENT DOCUMENTS

| | | | | |
|---|---|---|---|---|
| 6,426,891 | B1 * | 7/2002 | Katori | 365/175 |
| 6,456,524 | B1 * | 9/2002 | Perner et al. | 365/158 |
| 6,859,389 | B2 * | 2/2005 | Idehara | 365/163 |
| 2005/0047309 | A1 * | 3/2005 | Terao et al. | 369/108 |

FOREIGN PATENT DOCUMENTS

| | | |
|---|---|---|
| KR | 10-2003-0013762 | 2/2003 |
| KR | 10-2005-0078259 | * 8/2005 |

OTHER PUBLICATIONS

Machine Translation of Kang, KR10-2005-0078259.*
Office Action for corresponding Korean Application No. 10-2004-0109268 and English translation thereof.

* cited by examiner

*Primary Examiner*—A. Sefer
*Assistant Examiner*—Scott R Wilson
(74) *Attorney, Agent, or Firm*—Harness, Dickey & Pierce, PLC

(57) ABSTRACT

A nonvolatile memory device having two or more resistors and methods of forming and using the same. A nonvolatile memory device having two resistance layers, and more particularly, to a nonvolatile memory device formed and operated using a resistance layer having memory switching characteristics and a resistance layer having threshold switching characteristics. The nonvolatile semiconductor memory device may include a lower electrode; a first resistance layer having at least two resistance characteristics formed on the lower electrode, a second resistance layer having threshold switching characteristics formed on the first resistance layer, and an upper electrode formed on the second resistance layer.

7 Claims, 4 Drawing Sheets

NONVOLATILE MEMORY DEVICE HAVING TWO OR MORE RESISTANCE ELEMENTS AND METHODS OF FORMING AND USING THE SAME

PRIORITY STATEMENT

This application claims the benefit of Korean Patent Application No. 10-2004-0109268, filed on Dec. 21, 2004, in the Korean Intellectual Property Office, the disclosure of which is incorporated herein in its entirety by reference.

BACKGROUND

1. Field

Example embodiments of the present invention relate to a nonvolatile memory device having two resistance elements, and more particularly, to a nonvolatile memory device formed and operated using a resistance element having memory switching characteristics and a resistance element having threshold switching characteristics.

2. Description of the Related Art

A good semiconductor memory device must have a high integration density, which means that the number of memory cells per unit area is high, a high operation speed and/or a drive capability at low power. Thus, many efforts have been made to develop such a semiconductor device, and various kinds of memory devices are produced.

Generally, a semiconductor memory device includes many memory cells connected as circuits. In the case of a dynamic random access memory (DRAM) as a typical semiconductor memory device, a unit memory cell is normally composed of one switch and one capacitor. DRAMs have advantages of higher integration density and a higher operation speed. However, a DRAM's stored data is lost when power is cut off.

Conversely, a typical example of a nonvolatile memory device capable of storing data even with power cut off is a flash memory device. A flash memory device is nonvolatile, unlike a volatile memory device, but may have detriments of a lower integration density and/or a lower operation speed, as compared to a DRAM.

Recently, the types of nonvolatile memory devices under development may include a magnetic random access memory (MRAM), a ferroelectric random access memory (FRAM), and a phase-change random access memory (PRAM).

An MRAM stores data using change of magnetization direction at a tunnel junction and a FRAM stores data using polarity property of ferroelectrics. These devices have their own advantages and disadvantages, and mostly are studied and developed toward higher integration density, higher operation speed, a drive capability at lower power, and an improved data retention property.

A PRAM stores data using change of resistance values in accordance with phase change of specific materials, and has one resistance material layer and one switch (for example, a transistor). The resistance material layer used in the PRAM may be a chalcogenide resistor, which may have a crystal structure or an amorphous structure a formation temperature. Because a resistance in an amorphous state is normally higher than in a crystal structure, a memory device may be fabricated using this property. When a conventional fabrication process of a DRAM is employed to fabricate a PRAM, etching is difficult and it may take a long time. Further, conventional memory devices may have a problem of achieving a precise switching operation because its structure is complicated when switching using a transistor or diode.

SUMMARY OF THE INVENTION

Example embodiments of the present invention are directed to a nonvolatile semiconductor memory device, which is fabricated by a simpler fabrication process, has lower-power operation, higher-speed operation characteristics, and/or has only two resistors, without a transistor or a diode.

Example embodiments of the present invention are directed to a nonvolatile memory device having two ore more resistors and methods of forming and using the same.

Example embodiments of the present invention are directed to a nonvolatile memory device having two or more resistance elements and methods of forming and using the same.

Example embodiments of the present invention are directed to a nonvolatile memory device having two or more resistance layers and methods of forming and using the same.

According to an example embodiment of the present invention, there is provided a nonvolatile semiconductor memory device including a lower electrode, a first resistance layer having at least two resistance characteristics, formed on the lower electrode, a second resistance layer having threshold switching characteristics, formed on the first resistance layer, and an upper electrode formed on the second resistance layer.

In an example embodiment, the first resistance layer and/or the second resistance layer may include at least one phase change material layer.

In an example embodiment, the at least one phase change material layer of the first resistance layer may include at least one material selected for the group consisting of $Ni_{1-x}Ox$, $TiO_2$, $HfO$, $ZrO$, $ZnO$, $WO_3$, $CoO$, or $Nb_2O_5$ In an example embodiment, the at least one phase change material layer of the second resistance layer may include $V_2O_5$ or $TiAlO_3$.

According to another example embodiment of the present invention, there is provided a nonvolatile memory device array including a plurality of nonvolatile semiconductor memory devices, the lower electrodes of two or more of the plurality of nonvolatile semiconductor memory devices forming two or more bit lines, arranged in parallel, the upper lower electrodes of two or more of the plurality of nonvolatile semiconductor memory devices forming two or more word lines, arranged in parallel, the two or more bit lines and the two or more word lines intersecting, and the first and second resistance layers of each of the plurality of nonvolatile semiconductor memory devices being located at an intersection of a bit line and a word line.

According to another example embodiment of the present invention, there is provided a method of storing data in a nonvolatile semiconductor memory device including storing data in a first resistance layer and switching data into and out of the first resistance layer using a second resistance layer.

According to another example embodiment of the present invention, there is provided a method of forming a nonvolatile semiconductor memory device including forming a lower electrode, a first resistance layer having at least two resistance characteristics, a second resistance layer having threshold switching characteristics, and an upper electrode in a sequentially stacked structure.

According to another example embodiment of the present invention, there is provided a method of forming a nonvolatile memory device array including forming a plurality of nonvolatile semiconductor memory devices, the lower electrodes of two or more of the plurality of nonvolatile semiconductor memory devices forming two or more bit lines, arranged in parallel, the upper lower electrodes of two or more of the plurality of nonvolatile semiconductor memory devices forming two or more word lines, arranged in parallel, the two or more bit lines and the two or more word lines intersecting, and the first and second resistance layers of each of the plurality of nonvolatile semiconductor memory devices being located at an intersection of a bit line and a word line.

BRIEF DESCRIPTION OF THE DRAWINGS

The above and other features and advantages of example embodiments of the present invention will become more apparent by describing in detail example embodiments thereof with reference to the attached drawings in which.

DETAILED DESCRIPTION OF EXAMPLE EMBODIMENTS OF THE INVENTION

Figure 1:
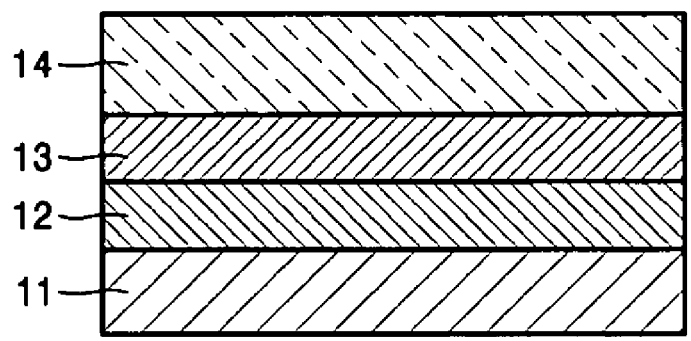
FIG. 1 is a sectional view illustrating a nonvolatile memory device having two resistance material layers according to an example embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on ", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

FIG. 1 is a sectional view illustrating a nonvolatile memory device having two resistance material layers according to an example embodiment of the present invention.

Referring to FIG. 1, the nonvolatile memory device according to an example embodiment of the present invention may have a structure, in which a lower electrode 11, a first resistance layer 12, a second resistance layer 13, and/or an upper electrode 14 are sequentially stacked. In an example embodiment, the first resistance layer 12 may function as a data storage part storing data, and the second resistance layer 13 may function as a conventional transistor or diode. The first resistance layer 12 may include at least one material selected from the group consisting of $Ni_{1-x}O_x$, $TiO_2$, HfO, ZrO, ZnO, $WO_3$, CoO, or $Nb_2O_5$. The second resistance layer 13 may be composed of a material having threshold switching characteristics, for example, $V_2O_5$ or $TiAlO_3$. These are all transition metal oxides having various resistance states, which may be characterized in that their properties may be changed by controlling the oxygen content. Example characteristics of the first resistance layer 12 and the second resistance layer 13 will be described below. It is noted that one or both of the first resistance layer 12 and the second resistance layer 13 may each be made up of one or more layers.

The lower electrode 11 and the upper electrode 14 may be composed of a conventional conductive material usable for an electrode material of a semiconductor device, for example, a metal material, and particularly, a material for the lower electrode 11 may be selectively determined in accordance with a material formed on the lower electrode 11.

Figure 2:
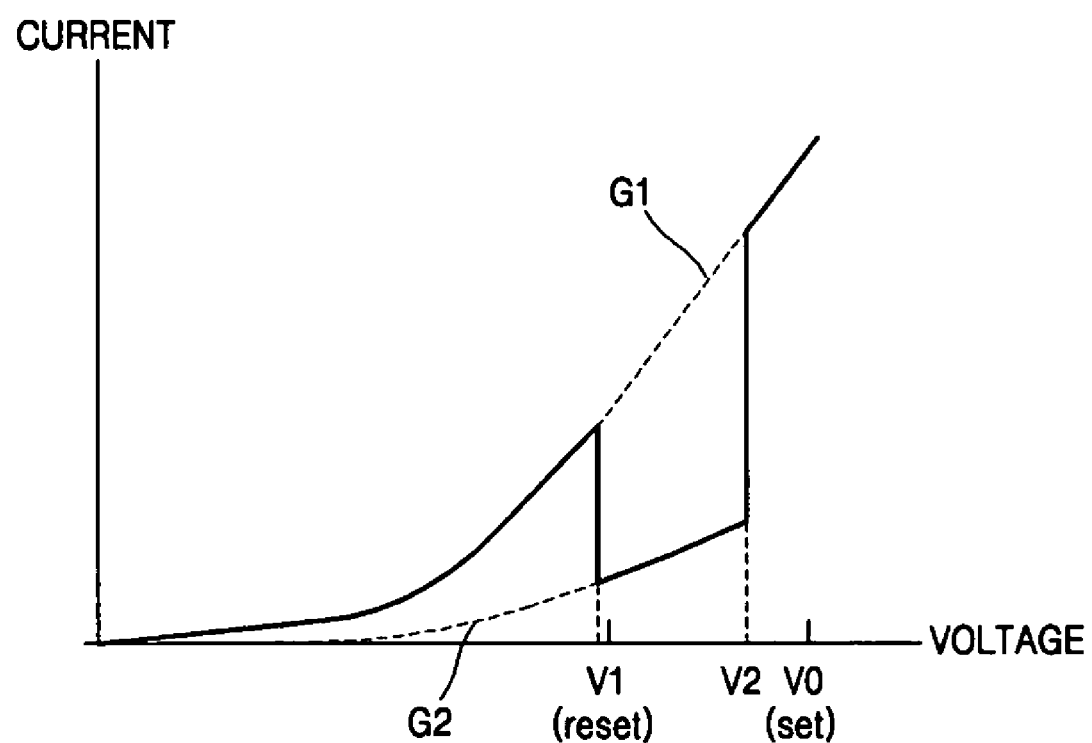
FIG. 2 is a graph illustrating operation characteristics of a nonvolatile memory device having two resistance material layers according to an example embodiment of the present invention.

FIG. 2 is a graph illustrating operation characteristics of a nonvolatile memory device having two (or more) resistance material layers according to an example embodiment of the present invention. Referring to FIG. 2, a transverse axis represents a value of the voltage applied to the first resistance layer through the lower electrode 11 and the upper electrode 14, and a longitudinal axis represents a value of the current flowing through the first resistance layer 12. In the graph, two current-voltage curves are shown. Curve G1 is a current-voltage curve showing that a current flowing through the first resistance layer 12 is high at a same voltage in the case that a resistance value of the first resistance layer 12 is decreased. Curve G2 is a current-voltage curve showing that a current flowing through the first resistance layer 12 is low at a same voltage in the case that a resistance value of the first resistance layer 12 is increased.

A nonvolatile memory device having two (or more) resistance material layers according to an example embodiment of the present invention may use different current-resistance characteristics as above. A more detailed description is set forth below.

In the case that an applied voltage is gradually increased from 0 V to a voltage V1, a current value increases in proportion to dimension of a voltage along the curve G1. However, if a voltage V1 is applied, a current value is abruptly decreased, and is changed along the curve G2. The phenomenon is found also in a voltage range of $V1 \leq V \leq V2$. If a voltage is applied with a dimension greater than a voltage V2, a current value is increased along the curve G1. A resistance value in accordance with characteristics of the curve G1 is called a first resistance value, and a resistance value in accordance with characteristics of the curve G2 is called a second resistance value. That is, a resistance of the first resistance layer 12 is abruptly increased in a voltage range of $V1 \leq V \leq V2$.

Further, the first resistance layer 12 of the nonvolatile memory device according to an example embodiment of the present invention may have characteristics as follows. After a voltage is applied in a range of $V1 \leq V \leq V2$, if a voltage is applied at a dimension smaller than a voltage $V1$, a current value is detected along the curve G2. After a voltage is applied in a range of $V2<V$, if a voltage is applied at a dimension smaller than a voltage V1, a current value is detected along the curve G1. Thus, usage of the characteristics as above can be employed to implement a memory device.

That is, if a voltage is applied in a range of $V2<V$ through the upper and lower electrodes 11, 14 of the nonvolatile memory device having two (or more) resistance material layers according to an example embodiment of the present invention, a first resistance value is stored in the first resistance layer 12. If a voltage is applied in a range of $V1 \leq V \leq V2$, a second resistance value is stored. In order to read a memory state stored in the first resistance layer 12, it is necessary to apply a voltage smaller than a voltage V1 so as to read a current value.

Figure 3A:
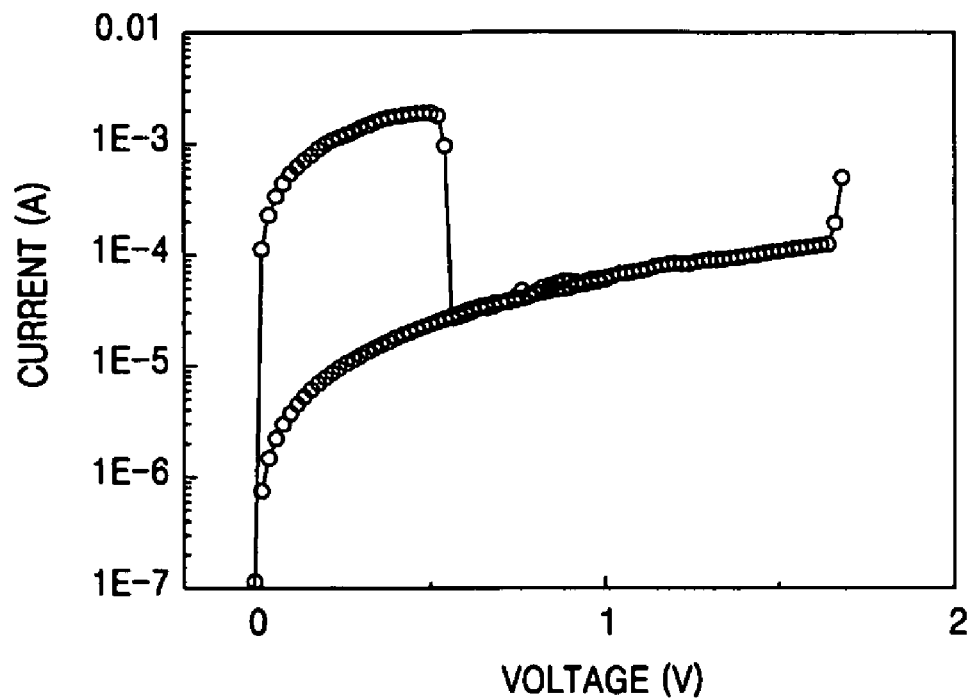
FIG. 3A is a graph illustrating electrical characteristics of a first resistance layer as memory switching characteristics of a nonvolatile memory device having two resistance material layers according to an example embodiment of the present invention.
Figure 3B:
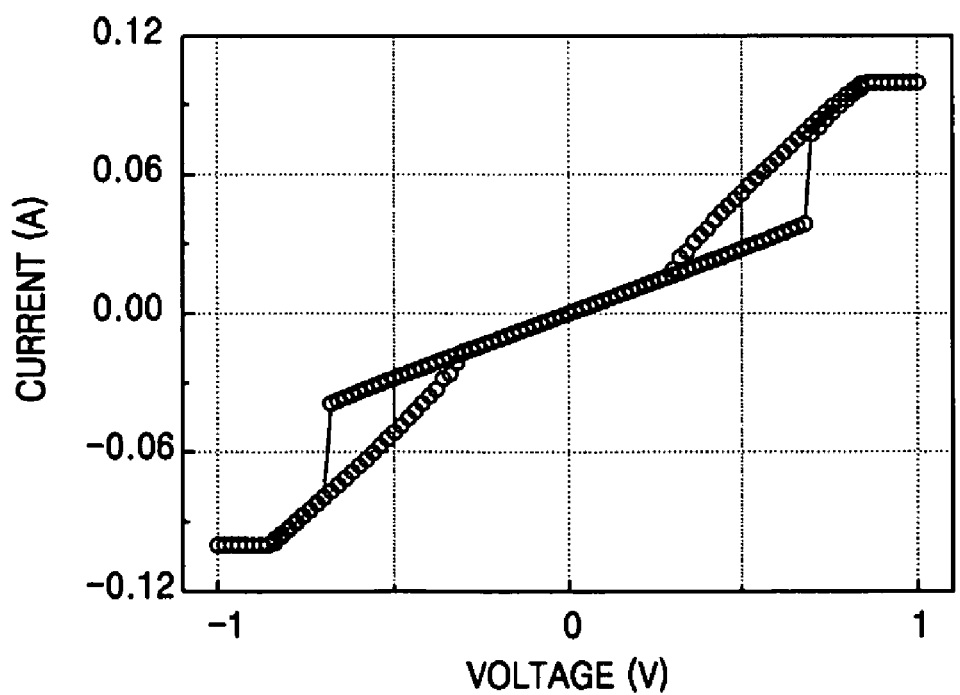
FIGS. 3B and 3C are graphs illustrating electrical characteristics of a second resistance layer as memory switching characteristics of a nonvolatile memory device having two resistance material layers according to an example embodiment of the present invention.
Figure 3C:
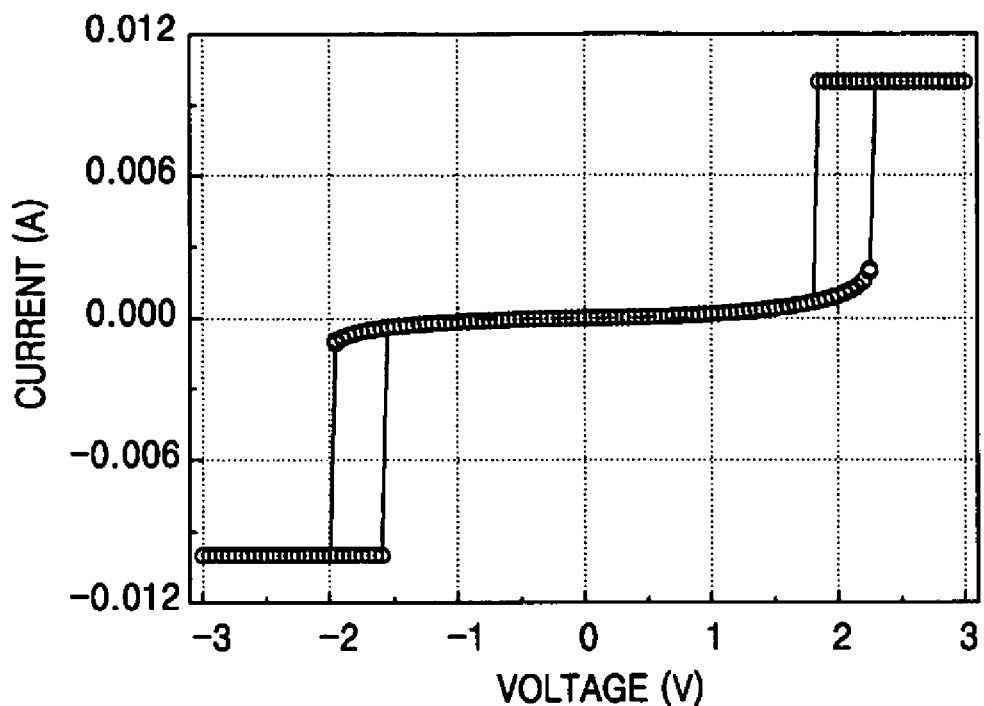

Example electrical characteristic graphs of the materials used in the first resistance layer 12 and the second resistance layer 13 are shown in FIGS. 3A through 3C.

FIG. 3A is a graph illustrating electrical characteristics of $Ni_{1-x}O_x$ used for the first resistance layer 12. FIG. 3A illustrates two resistance characteristics in a voltage range equal to or lower than about 0.55 V. That is, because $Ni_{1-x}O_x$ shows two resistance characteristics at a same applied voltage, it can be used as a data storage part of a memory device.

FIG. 3B is a graph illustrating electrical characteristics of $V_2O_5$ used for the second resistance layer 13 according to an example embodiment of the present invention and FIG. 3C is a graph illustrating electrical characteristics of $TiAlO_3$ used for the second resistance layer 13 according to an example embodiment of the present invention. Referring to FIGS. 3B and 3C, these have various voltage-current states, and particularly, current flows by a current compliance at a voltage of about 2 V or higher as shown in FIG. 3C, but current does not flow at a voltage in a range of −2 V through 2 V. That is, as the material has its own threshold voltage, and only if a given voltage or higher is applied, current flows, and in the case that a voltage is higher than a given voltage, an almost identical current flows. Thus, example embodiment of the present invention may be employed as a switching device, for example, a transistor or a diode, using the above characteristics.

Figure 4:
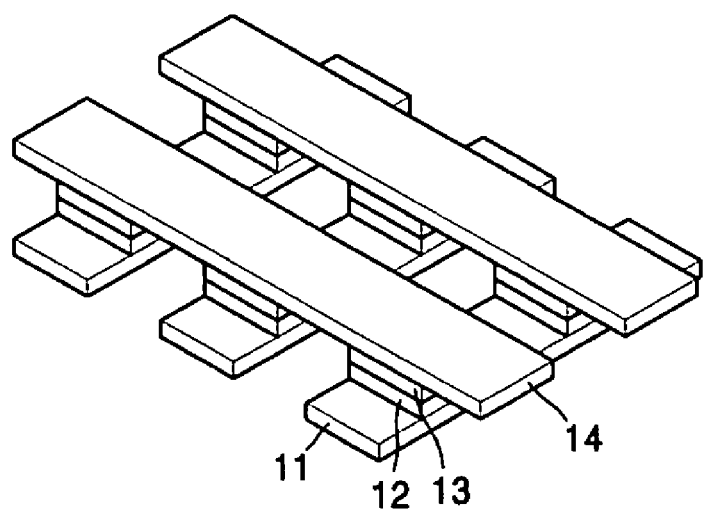
FIG. 4 is a perspective view illustrating an array structure of a nonvolatile memory device having two resistance material layers according to an example embodiment of the present invention.

FIG. 4 is a perspective view illustrating an array structure of a nonvolatile memory device having two resistance material layers according to an example embodiment of the present invention. Referring to FIG. 4, lines of the lower electrode 11 and lines of the upper electrode 14 may be disposed across each other, and the first resistance layer 12 and the second resistance layer 13 may be disposed at points where the lines of the lower electrode 11 and the lines of the upper electrode 14 cross.

Figure 5:
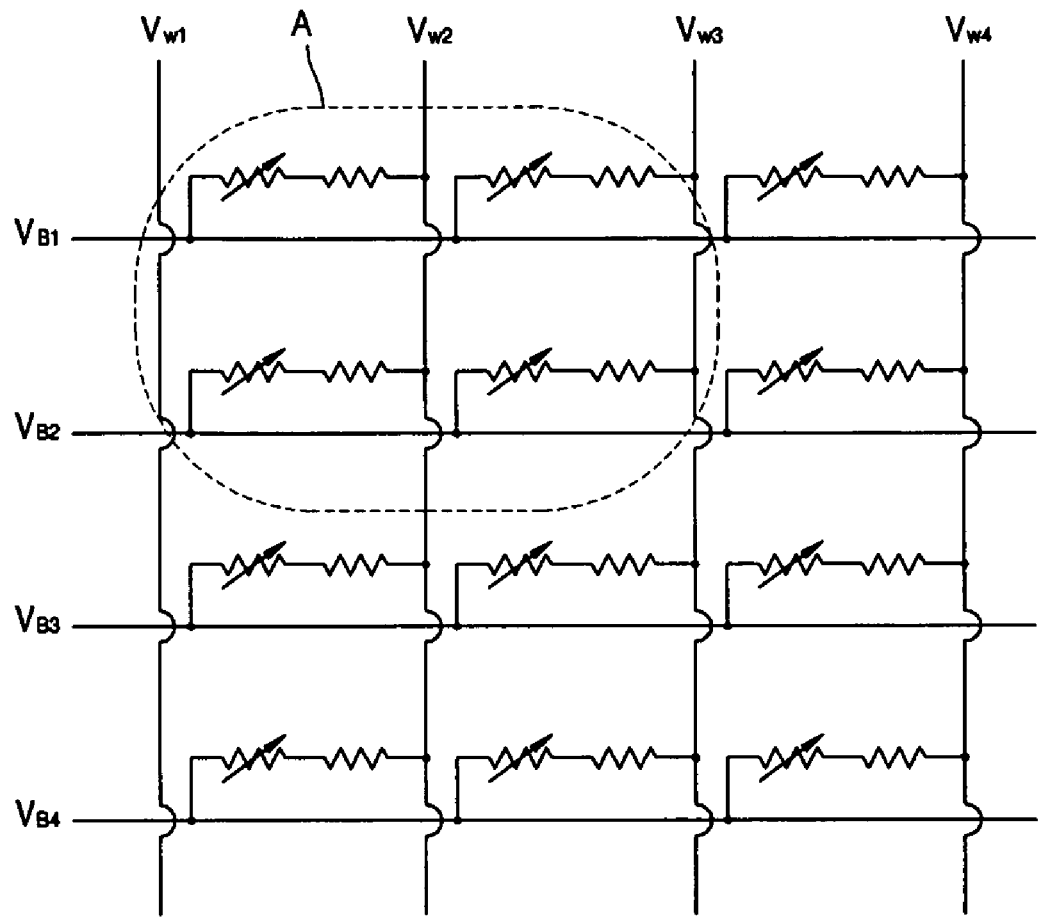
FIG. 5 is an equivalent circuit diagram of an array of a nonvolatile memory device having two resistance material layers according to an example embodiment of the present invention.
Figure 6:
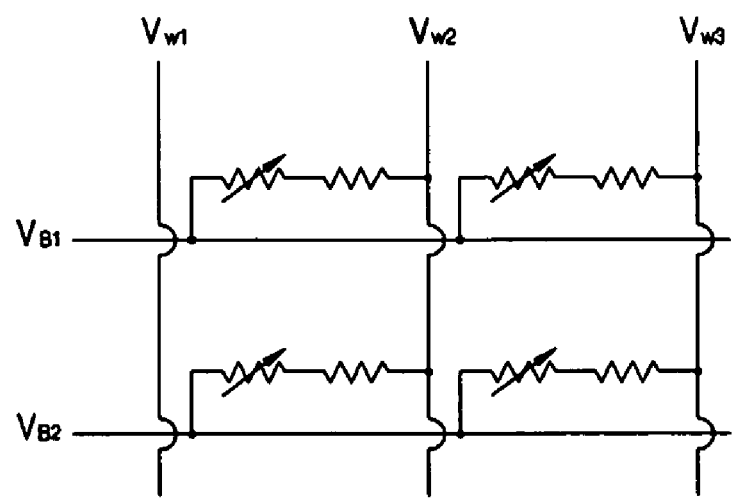
FIG. 6 is an example circuit diagram illustrating four unit cells in a region 'A' of FIG. 5.

FIG. 5 is an example equivalent circuit diagram of an array of a nonvolatile memory device having two resistance material layers of FIG. 4. FIG. 6 illustrates four example unit cells in a region A of FIG. 5. Hereinafter, an operation method of the nonvolatile memory device having two (or more) resistance material layers according to an example embodiment of the present invention will be described in reference to FIGS. 5 and 6. As shown, lines $V_{B1}$, $V_{B2}$ and word lines $V_{W2}$, $V_{W3}$ share two cells, respectively.

When the unit cell disposed at a lower left part of FIG. 6 maintains an 'ON state', and the rest of unit cells maintain an 'OFF state', a voltage equal to or greater than a threshold voltage of the second resistance layer 13 is applied to the word line $V_{w2}$. When the second resistance layer 13 is composed of $TiAlO_3$ as shown in FIG. 3C, a voltage equal to or greater than 2 V is applied to the word line $V_{w2}$, and a voltage is not applied to the rest of the word lines. If a voltage of the bit line $V_{B1}$ maintains 0.5 V, and a voltage is not applied to the word line $V_{B2}$, because a voltage difference of the upper and lower electrodes 11, 14 only in a lower left unit cell is higher than a threshold voltage of the second resistance layer 13, current flows. As such, 'ON' and 'OFF' states can be controlled in desired unit cells as described so data may be stored or erased.

Example embodiments have been described in detail, but they do not limit the scope of the present invention, and must be understood as example embodiments.

As described above, example embodiments of the present invention may have one or more advantages as follows.

A unit cell of a nonvolatile memory according to example embodiments of the present invention may have a 2R (or multiple R) structure, in which a resistor is used as a transistor or a diode. Therefore, the structure may be simplified, and thus, an entire structure of the array cell composed of unit cells may also be simplified.

Example embodiments of the present invention may employ conventional semiconductor fabrication processes which are normally used in order to fabricate a conventional DRAM. Further, because resistance layers can be formed in-situ manner unlike a memory device including a conventional switching element, fabrication processes may be simplified so that productivity may be increased and/or fabrication costs decreased.

Example embodiments of the present invention may employ a material having particular resistance properties so that data can be stored and read easier and using more simplified methods. In example embodiments of the present invention, higher speed operation characteristics may be provided.

In other example embodiments, the phase change material layer may include other chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material layer may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material layer may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material layer is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the phase change material layer may be made of a transition metal oxide having multiple resistance states, as described above. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The phase change material layer may be a chemical compound including one or more elements selected from the group consisting of S, Se, Te, As, Sb, Ge, Sn, In and Ag.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A nonvolatile semiconductor memory device comprising:
    a lower electrode;
    a first resistance layer having at least two resistance characteristics, formed on the lower electrode and configured to function as a data storage part;
    a second resistance layer having threshold switching characteristics, formed on the first resistance layer, the first and the second resistance layers being made of different materials; and
    an upper electrode formed on the second resistance layer.

2. The nonvolatile semiconductor memory device according to claim 1, wherein the first resistance layer includes at least one phase change material layer.

3. The nonvolatile semiconductor memory device according to claim 2, wherein the at least one phase change material layer is made of at least one material selected from the group consisting of $Ni_{1-x}O_x$, $TiO_2$, HfO, ZrO, ZnO, $WO_3$, CoO, or $Nb_2O_5$.

4. The nonvolatile semiconductor memory device according to claim 1, wherein the second resistance layer includes at least one phase change material layer.

5. The nonvolatile semiconductor memory device according to claim 4, wherein the at least one phase change material layer is made of $V_2O_5$ or $TiAlO_3$.

6. The nonvolatile semiconductor memory device according to claim 1, wherein the nonvolatile semiconductor memory device does not include a transistor or diode for switching.

7. A nonvolatile memory device array including a plurality of nonvolatile semiconductor memory devices according to claim 1,
    the lower electrodes of two or more of the plurality of nonvolatile semiconductor memory devices forming two or more bit lines, arranged in parallel,
    the upper lower electrodes of two or more of the plurality of nonvolatile semiconductor memory devices forming two or more word lines, arranged in parallel,
    the two or more bit lines and the two or more word lines intersecting, and
    the first and second resistance layers of each of the plurality of nonvolatile semiconductor memory devices being located at an intersection of a bit line and a word line.

* * * * *